(12) United States Patent
Abe

(10) Patent No.: US 7,644,325 B2
(45) Date of Patent: Jan. 5, 2010

(54) SEMICONDUCTOR INTEGRATED CIRCUIT DEVICE AND METHOD OF TESTING THE SAME

(75) Inventor: Tsuneo Abe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 295 days.

(21) Appl. No.: 11/727,452

(22) Filed: Mar. 27, 2007

(65) Prior Publication Data

US 2007/0245186 A1  Oct. 18, 2007

(30) Foreign Application Priority Data

Mar. 28, 2006 (JP) .............................. 2006-087926

(51) Int. Cl.
  G01R 31/28  (2006.01)
  G01R 31/30  (2006.01)
(52) U.S. Cl. ...................................... 714/724; 714/745
(58) Field of Classification Search ................. 714/745, 714/718, 724
  See application file for complete search history.

(56) References Cited

U.S. PATENT DOCUMENTS

| 6,512,707 B2 | 1/2003 | Miura et al. |
| 6,720,807 B1 * | 4/2004 | Kubo et al. ................. 327/141 |
| 6,834,020 B2 | 12/2004 | Takahashi et al. |
| 6,968,490 B2 * | 11/2005 | Tarango et al. .............. 714/738 |
| 7,206,981 B2 * | 4/2007 | Schoenborn et al. ........ 714/724 |
| 7,373,574 B2 * | 5/2008 | Kojima ........................ 714/738 |
| 2005/0012533 A1 | 1/2005 | Aoyama et al. |

FOREIGN PATENT DOCUMENTS

| JP | 2001-357671 | 12/2001 |
| JP | 2002-8393 | 1/2002 |
| JP | 2005-39549 | 2/2005 |

* cited by examiner

Primary Examiner—James C Kerveros
(74) Attorney, Agent, or Firm—Young & Thompson

(57) ABSTRACT

A semiconductor integrated circuit device includes a control circuit configured to generate a control code to control a parameter of a predetermined circuit and outputs the control code to the predetermined circuit; and a latch circuit connected with an output of the control circuit to latch the control code in response to a control signal. The latch circuit may be provided between the control circuit and the predetermined circuit to latch the control code or transfer the control code to the predetermined circuit, in response to the control signal.

18 Claims, 5 Drawing Sheets

SEMICONDUCTOR INTEGRATED CIRCUIT DEVICE AND METHOD OF TESTING THE SAME

BACKGROUND OF THE INVENTION

1. Field of the Invention

The present invention relates to a semiconductor integrated circuit device. More particularly, the present invention relates to a semiconductor integrated circuit device having an automatically adjusting function and a method of testing the same.

2. Description of the Related Art

FIG. 1 is a block diagram showing a configuration of a conventional semiconductor integrated circuit device having an automatically adjusting function. An automatically adjusting circuit 101 automatically adjusts a parameter with regard to an arbitrary target circuit 102. For example, the target circuit 102 is an output buffer of a data input/output circuit provided in DRAM. The automatically adjusting circuit 101 automatically adjusts an output impedance of the output buffer. This is disclosed in Japanese Laid Open Patent Application (JP-P2005-39549A). When the parameter is automatically adjusted, the target circuit 102 can operate in a corrected state.

In conjunction with the above description, a semiconductor integrated circuit device is disclosed in Japanese Laid Open Patent Application (JP-P2002-8393A). In this conventional example, the semiconductor integrated circuit device includes a memory circuit for performing a read operation in which a plurality of data are read out in parallel, a plurality of data lines to transfer the plurality of data outputted from the memory circuit, and a first signal transfer path to transfer a control signal for instructing the start of the read operation to the memory circuit. A first data latch circuit latches a signal level of an internal node in response to a test timing signal which is activated after a preset time elapse after the control signal is activated. The second signal transfer path transfers the test timing signal to the first data latch circuit. A data transfer path is arranged between one of the plurality of data lines and the internal node. A signal delay circuit is arranged in at least one of the first and second signal transfer paths.

Also, a semiconductor memory device is disclosed in Japanese Laid Open Patent Application (JP-P2001-357671A). The semiconductor memory device of this conventional example has a memory cell array of memory cells which need a refreshing operation, and a write request and a write data are asynchronously supplied to an access address. An access section performs the refreshing operation on the memory cell array after performing a read or write for the access address to the memory cell array. A control section controls the access section to late write to the memory cell array by using a write data and the access address supplied in a memory cycle after a memory cycle in which the write request is supplied.

SUMMARY OF THE INVENTION

It is therefore an object of the present invention to provide a semiconductor integrated circuit device having an adjusting circuit, in which an adjustment result at any time can be obtained without any influence on the adjusting circuit.

Another object of the present invention is to provide a semiconductor integrated circuit device having an adjusting circuit, in which a performance of the adjusting circuit can be tested at any time during an automatically adjusting operation.

In an aspect of the present invention, a semiconductor integrated circuit device includes a control circuit configured to generate a control code to control a parameter of a predetermined circuit and outputs the control code to the predetermined circuit; and a latch circuit connected with an output of the control circuit to latch the control code in response to a control signal.

The latch circuit may be provided between the control circuit and the predetermined circuit to latch the control code or transfer the control code to the predetermined circuit, in response to the control signal.

The latch circuit may be connected with the control circuit through a path different from a path through which the control circuit is connected with the predetermined circuit.

Also, the semiconductor integrated circuit device may further include an external output circuit connected with the latch circuit to output the control code latched by the latch circuit to an external unit.

Also, the semiconductor integrated circuit device may further include a register circuit connected with the latch circuit, comprising at least one register and configured to store the control code. In this case, the register circuit may include a plurality of registers configured to store a plurality of the control codes in time series.

Also, the semiconductor integrated circuit device may further include a selecting circuit configured to select one of the plurality of control codes and to output the selected control code to the predetermined circuit.

Also, the semiconductor integrated circuit device may further include an external output circuit connected with the register circuit to output the control code to an external unit.

Also, the control circuit may be an impedance control circuit configured to control an impedance of the predetermined circuit. In this case, the predetermined circuit and the control circuit may be provided in a DRAM.

In another aspect of the present invention, a method of testing a semiconductor integrated circuit device which includes a control circuit configured to a parameter of a predetermined circuit and a latch circuit, is achieved by (A) generating a control code to control the parameter of the predetermined circuit by the-control circuit and outputting the control code to the predetermined circuit; by (B) latching the control code by the latch circuit in response to a control signal; and by (C) testing performance of the control circuit based on the control code.

Also, in another aspect of the present invention, a method of testing a semiconductor integrated circuit device which includes a control circuit configured to a parameter of a predetermined circuit, a latch circuit, and a register circuit, is achieved by (A) generating a control code to control the parameter of the predetermined circuit by the control circuit and outputting the control code to the predetermined circuit; by (B) latching the control code by the latch circuit in response to a control signal; by (C) storing the control code by the register circuit; and by (D) testing performance of the control circuit based on the control code.

According to the present invention, the semiconductor integrated circuit device having the adjusting circuit is provided. According to the semiconductor integrated circuit device, the adjustment result can be obtained at any time without any influence on the adjusting circuit. Also, the performance of the adjusting circuit can be tested at any time during the automatically adjusting operation.

DESCRIPTION OF THE PREFERRED EMBODIMENTS

Hereinafter, a semiconductor integrated circuit device according to the present invention and a method of testing the same will be described in detail with reference to the attached drawings.

The semiconductor integrated circuit device according to the present invention contains an automatically adjusting circuit. As the semiconductor integrated circuit device, DRAM and SDRAM are exemplified. In this case, the automatically adjusting circuit automatically adjusts an output impedance of an output buffer of a data input/output circuit provided in the DRAM.

Figure 1:
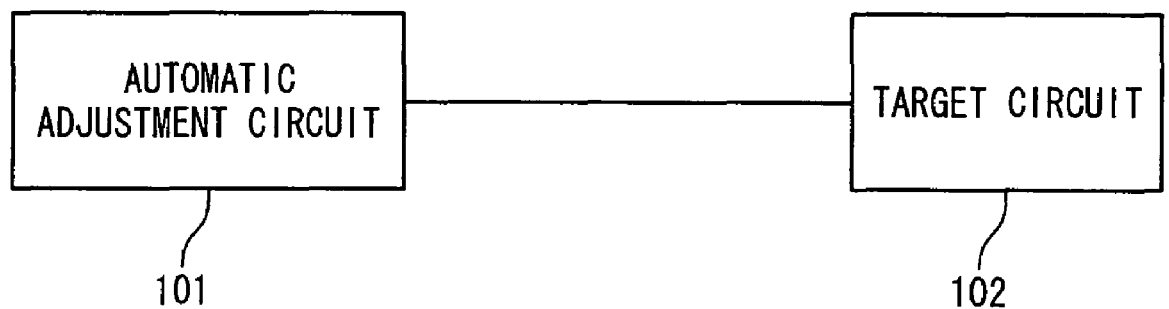
FIG. 1 is a block diagram showing the configuration of a conventional semiconductor integrated circuit device having an automatically adjusting circuit.
Figure 2:
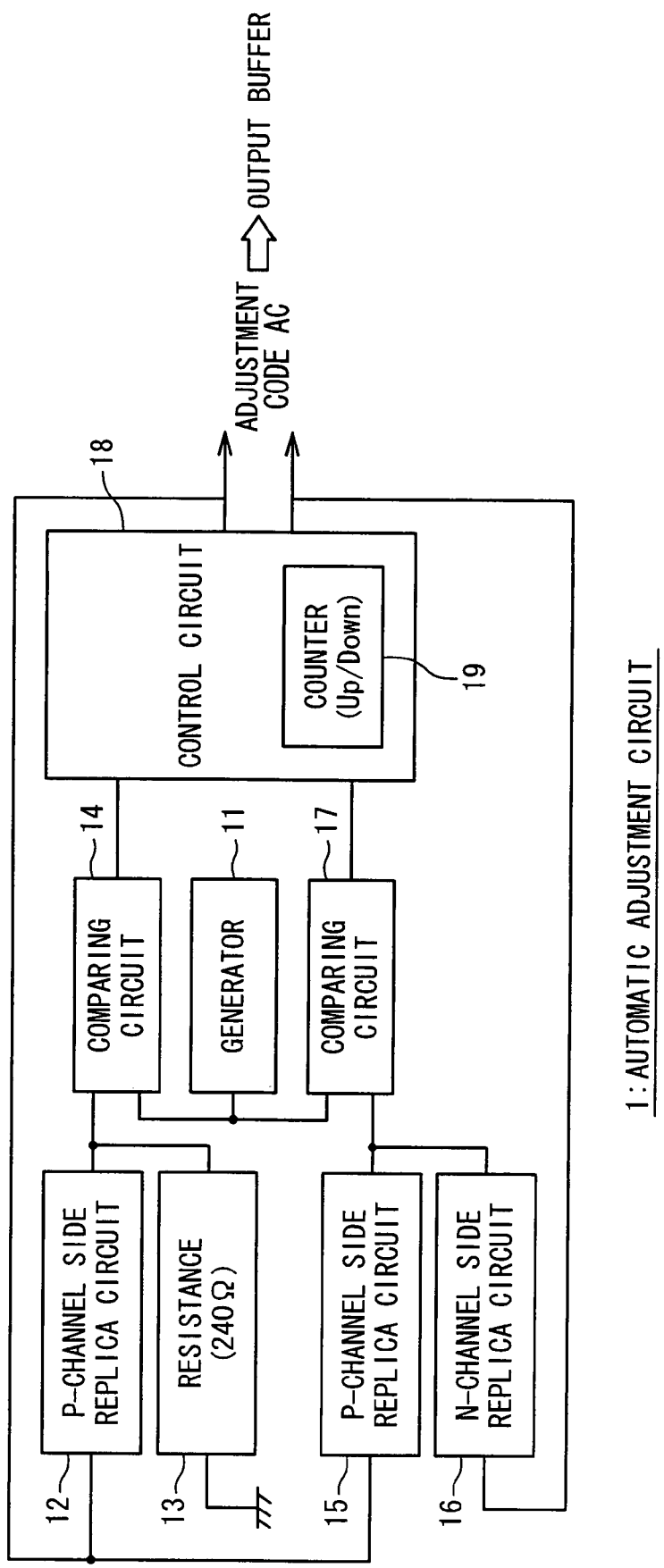
FIG. 2 is a block diagram showing the configuration of a semiconductor integrated circuit device according to the present invention in which an output impedance adjusting circuit is used as the automatically adjusting circuit.

FIG. 2 shows one example of an automatic output impedance adjusting circuit (ZQ circuit) for adjusting the output impedance. The ZQ circuit 1 has a generator 11, a P-channel side replica circuits 12 and 15, a N-channel side replica circuit 16, a resistor 13, comparing circuits 14 and 17, a control circuit 18 and a counter 19.

The generator 11 is a power supply for generating a voltage (VDDQ/2) equal to a half of a power supply voltage VDDQ. An output voltage of the generator 11 is supplied to the comparing circuits 14 and 17. The replica circuits 12, 15 and 16 are imitation circuits that are formed similarly to the output buffer as an adjustment target. Each of their output terminals is connected to the comparing circuit 14 or 17. Also, one end of the resistor 13 (for example, 240 Ω) is connected to a ground, and the other is connected to an output of the replica circuit 12. Each of the comparing circuits 14 and 17 is a voltage comparing circuit for comparing the voltage supplied from one of the replica circuits 12, 15 and 16 and the voltage (VDDQ/2) generated by the generator 11. The control circuit 18 performs the adjustment of the output impedance in accordance with the comparison results outputted by the comparing circuits 14 and 17.

When being set to a ZQ mode (automatic output impedance adjustment mode), the ZQ circuit 1 operates as follows. The comparing circuit 14 compares a voltage obtained through resistor-division by the resistor 13 and the P-channel side replica circuit 12, and the voltage VDDQ/2 generated by the generator 11. The control circuit 18 generates a first signal for increasing the output impedance of the replica circuit 12 or a second signal for decreasing the output impedance. This first or second signal is fed back to the P-channel side replica circuit 12. Also, the number of the generated first or second signals is counted by the counter 19 in the control circuit 18.

The output impedance is changed in accordance with the first or second signal fed back to the P-channel side replica circuit 12. Until the voltages supplied to the comparing circuit 14 are coincident, the output impedance is changed through the feedback. Meanwhile, the counter 19 in the control circuit 18 continues the counting operation. As a result, the resistance value of the P-channel side replica circuit 15 is automatically adjusted to the value (240 Ω) by the comparing circuit 17. Similarly, the resistance value of the N-channel side replica circuit 16 is automatically adjusted to 240 Ω by the comparing circuit 17.

When the process is completed in the ZQ circuit 1, the count value held by the counter 19 indicates the result of the adjusting process. The ZQ circuit 1 sends the count value, which is the result of these adjusting processes, as Adjustment Code AC to the output buffer. In this way, the ZQ circuit 1 automatically generates the adjustment code AC for adjusting the output impedance of the output buffer, and distributes the adjustment code AC to the respective output buffers. The output impedance of the output buffer is adjusted to a desirable value in accordance with the adjustment code AC.

First Embodiment

Figure 3:
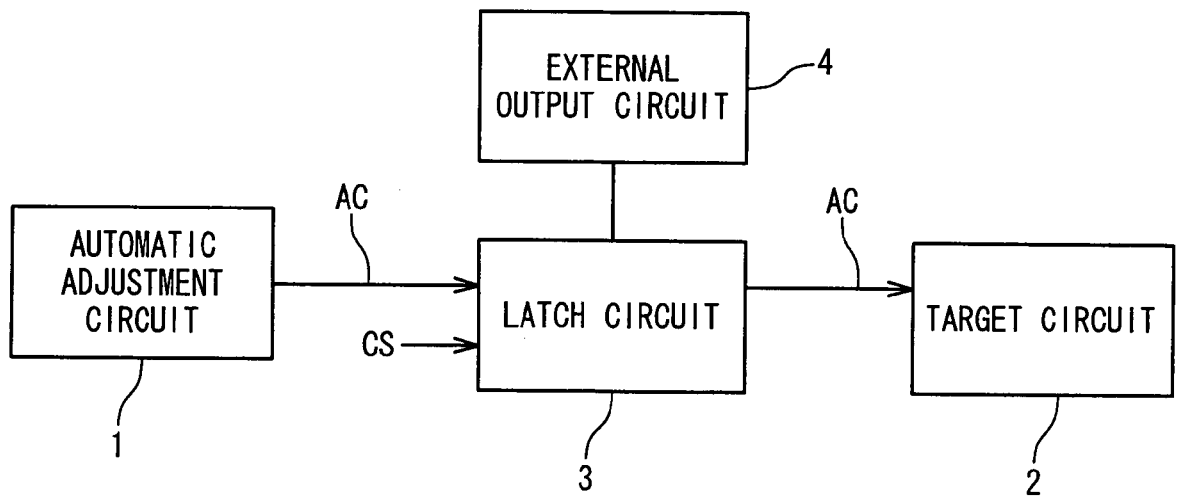
FIG. 3 is a block diagram showing the configuration of the semiconductor integrated circuit device according to a first embodiment of the present invention.

FIG. 3 is a block diagram showing the configuration of the semiconductor integrated circuit device according to the first embodiment of the present invention. The semiconductor integrated circuit device contains an automatically adjusting circuit 1, a target circuit 2, a latch circuit 3 and an external output circuit 4. When the semiconductor integrated circuit device is set to an automatic adjustment mode, the automatically adjusting circuit 1 generates an adjustment code AC to adjust a parameter of the target circuit 2 and outputs the adjustment code AC to the target circuit 2. For example, the automatically adjusting circuit 1 is the ZQ circuit shown in FIG. 2, and the target circuit 2 is the output buffer in the data input/output circuit. In that case, the automatically adjusting circuit 1 sends the adjustment code AC to the output buffer to adjust the output impedance of the output buffer.

In FIG. 3, the latch circuit 3 is located between the automatically adjusting circuit 1 and the target circuit 2. When the semiconductor integrated circuit device is set to the automatic adjustment mode, the latch circuit 3 receives the adjustment code AC outputted by the automatically adjusting circuit 1. Then, the latch circuit 3 latches the adjustment code AC in accordance with a control signal CS, or sends the adjustment code AC in its original state to the target circuit 2.

A user can activates the control signal CS (control trigger) at any timing in the automatic adjustment mode. When the control signal CS is activated, the latch circuit 3 carries out its function, and the adjustment code AC (automatic adjustment result) at that time is held by the latch circuit 3. Here, since the latch circuit 3 is arranged outside the automatically adjusting circuit 1, the latch operation of the latch circuit 3 has no influence on the automatically adjusting circuit 1. In this way, according to this embodiment, it is possible to obtain the adjustment code AC (adjustment result) at any time without any influence on the automatically adjusting circuit 1.

Also, the user can properly use the adjustment code AC at any time held by the latch circuit 3. For example, in FIG. 3, the external output circuit 4 connected to the latch circuit 3 is provided. The external output circuit 4 can output the adjustment code AC held by the latch circuit 3 to a measuring unit connected to an external unit. The measuring unit or user can test the performance and property of the automatically adjusting circuit 1 at any time in accordance with the adjustment code AC outputted to the external unit. Conventionally, since the external measuring unit could not operate in conjunction with the automatically adjusting function, the performance of the automatically adjusting function could not be tested at any time. However, according to this embodiment, since the data latched at any time during the automatically adjusting process is outputted to the external unit, the performance of the automatically adjusting function at that time can be tested.

Moreover, after the activation of the control signal CS, the adjustment code AC is not transferred to the target circuit 2. Thus, even if the automatically adjusting circuit 1 continues the adjusting process, the target circuit 2 does not receive the influence at all. This effect is as follows. It is supposed that a different operation is instructed to the target circuit 2, prior to the completion of the automatically adjusting operation. For example, there is a possibility that the time of the automatically adjusting process becomes longer than an estimated time because of the influence of external noise so that it exceeds the time defined by a specification. In that case, there is a case that the user instructs the target circuit 2 to carry out the different operation (this is an allowable action because the instruction is issued after the time specified by the specification). In such a case, there is a possibility that the automatically adjusting process under the continuation disturbs the specified different operation and involves a trouble. However, according to this embodiment, the update of the result of the automatically adjusting process can be stopped at any time. Therefore, even if the user specifies the different operation externally, it is possible to avoid the automatically adjusting circuit 1 from having adverse influence.

As explained above, according to this embodiment, the result of the automatically adjusting process can be held at any time during the automatically adjusting process. Through the use of the held value, the property of the automatically adjusting function can be tested at any time. Also, the held value can be used as a start point of a next automatically adjusting process. Also, since the held value is fed back to the control circuit 18 in the automatically adjusting circuit 1, the automatically adjusting function can be optimized. Moreover, by using the latch circuit 3 and stopping the update of the adjustment code AC at any time, it is possible to protect the automatically adjusting circuit 1 from having the bad influence on the different operation.

Figure 4:
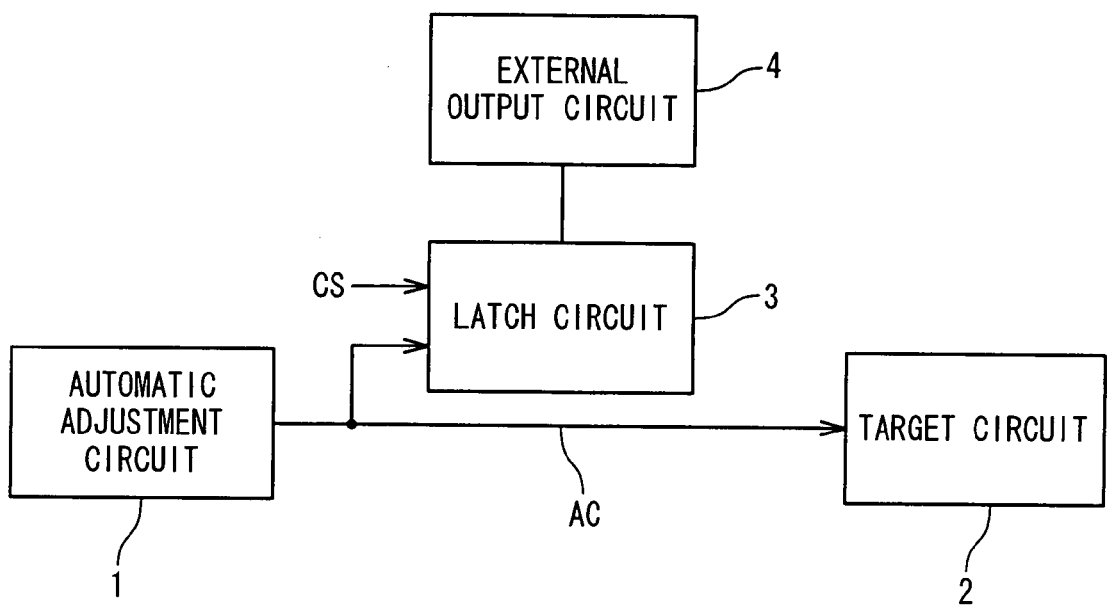
FIG. 4 is a block diagram showing a modification of the semiconductor integrated circuit device according to the first embodiment.

FIG. 4 shows the variation in the semiconductor integrated circuit device according to this embodiment. In FIG. 4, the latch circuit 3 is not located between the automatically adjusting circuit 1 and the target circuit 2. The latch circuit 3 is connected to the output of the automatically adjusting circuit 1, through a route different from a route through which the automatically adjusting circuit 1 and the target circuit 2 are connected. In this case, without any influence on the automatically adjusting circuit 1 and the target circuit 2, the latch circuit 3 can be used to obtain the adjustment code AC (adjustment result) at any time.

Similarly to the case shown in FIG. 3, the user can properly use the adjustment code AC at any time held by the latch circuit 3. For example, the external output circuit 4 connected to the latch circuit 3 outputs the adjustment code AC held by the latch circuit 3 to the measuring unit connected externally. The measuring unit or user can test the performance and property of the automatically adjusting circuit 1 at any time in accordance with the adjustment code AC outputted externally.

Second Embodiment

Figure 5:
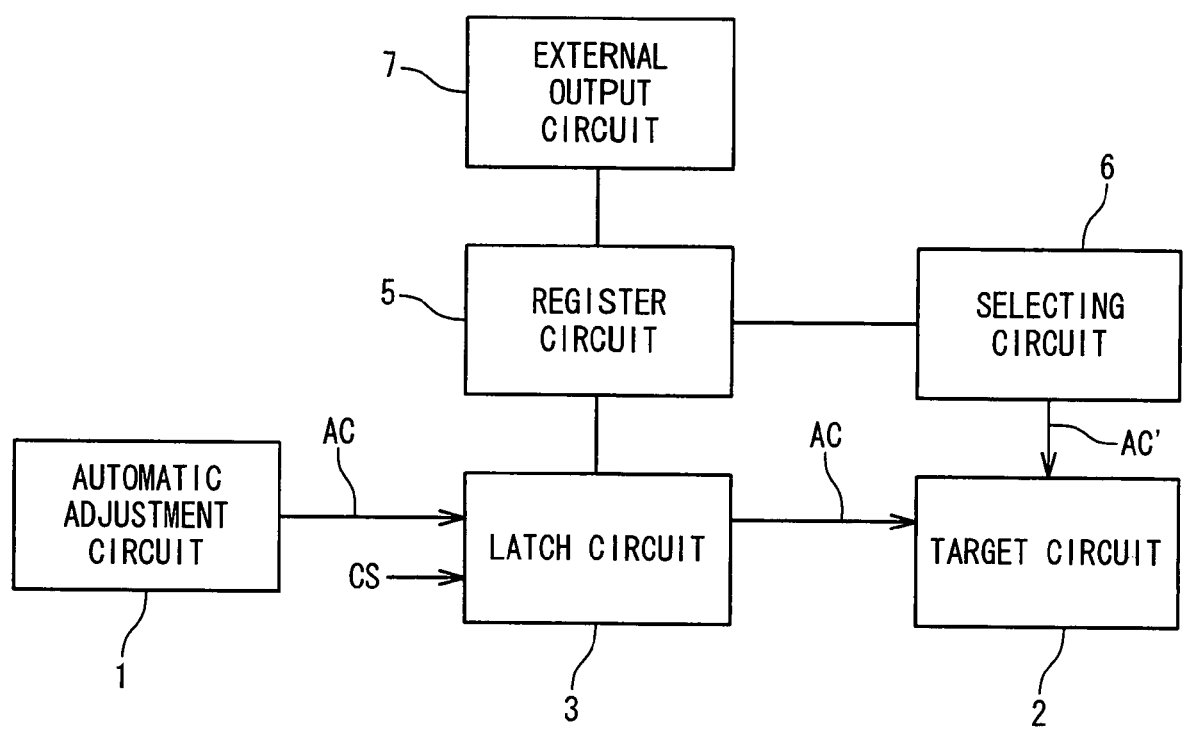
FIG. 5 is a block diagram showing the configuration of the semiconductor integrated circuit device according to a second embodiment of the present invention.

FIG. 5 is a block diagram showing the configuration of the semiconductor integrated circuit device according to the second embodiment of the present invention. In FIG. 5, the same reference numerals or symbols are assigned to the same configurations as those in the first embodiment, and the description thereof is properly omitted.

The semiconductor integrated circuit device shown in FIG. 5 contains the automatically adjusting circuit 1, the target circuit 2, the latch circuit 3, a register circuit 5, a selecting circuit 6 and an external output circuit 7. The latch circuit 3 is located between the automatically adjusting circuit 1 and the target circuit 2. When the semiconductor integrated circuit device is set to the automatic adjustment mode, the latch circuit 3 receives the adjustment code AC outputted by the automatically adjusting circuit 1. Then, the latch circuit 3 latches the adjustment code AC in accordance with the control signal CS, or sends the adjustment code AC in its original state to the target circuit 2.

According to this embodiment, the register circuit 5 connected to the latch circuit 3 is provided. The register circuit 5 includes at least one register and stores the adjustment code AC latched by the latch circuit 3. If the register circuit 5 includes a plurality of registers, the plurality of registers store the plurality of adjustment codes AC latched by the latch circuit 3 at a plurality of timings, respectively. That is, the plurality of adjustment codes AC at the different timings are stored in time sequence in the register circuit 5. In this way, according to this embodiment, without any influence on the automatically adjusting circuit 1, it is possible to obtain and use the adjustment codes AC (adjustment results) at the different timings.

For example, in FIG. 5, the selecting circuit 6 connected to the register circuit 5 is provided. The selecting circuit 6 selects one of the plurality of adjustment codes AC stored in the register circuit 5 and outputs the selected adjustment code AC' to the target circuit 2. The parameter of the target circuit 2 is adjusted in accordance with the adjustment code AC' sent by the selecting circuit 6. In this way, it is possible to flexibly adjust the target circuit 2 by using the register circuit 5.

Also, in FIG. 5, the external output circuit 7 connected to the register circuit 5 is provided. The external output circuit 7 can output at least one adjustment code AC stored in the register circuit 5 to an external measuring unit. The measuring unit or user can test the performance and property of the automatically adjusting circuit 1 at any time in accordance with the adjustment code AC outputted externally. In particular, when the plurality of adjustment codes AC arranged in the time sequence are outputted externally, the test precision of the automatically adjusting circuit 1 is improved.

Moreover, after the activation of the control signal CS, the adjustment code AC is not transferred to the target circuit 2. Thus, even if the automatically adjusting circuit 1 continues the adjusting process, the target circuit 2 does not receive any influence at all. Therefore, even if the user instructs a different operation from the external prior to the completion of the automatically adjusting operation, it is possible to protect the automatically adjusting circuit 1 from having the adverse influence on the different operation.

As mentioned above, according to this embodiment, the adjustment code AC (adjustment result) at the different timing during the automatically adjusting process can be stored in the register circuit 5. The time sequential property of the automatically adjusting function can be used through the stored value. Also, any value stored in the register circuit 5 can be stored as the start point of the next automatically adjusting process. Also, by the feedback of the stored value to the control circuit 18 in the automatically adjusting circuit 1, the optimization of the automatically adjusting function can be carried out. Moreover, since the latch circuit 3 is used to stop the update of the adjustment code AC, it is possible to protect the automatically adjusting circuit 1 from having the bad influence on the different operation.

Figure 6:
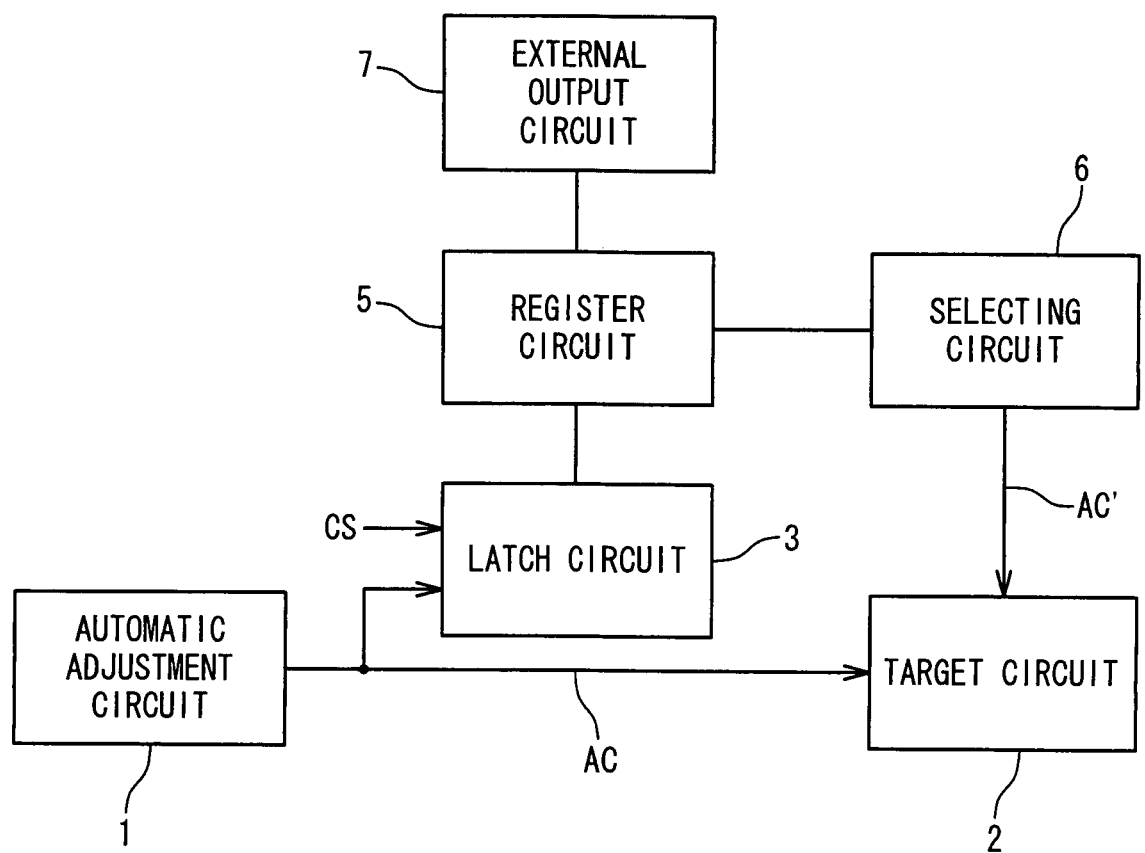
FIG. 6 is a block diagram showing a modification of the semiconductor integrated circuit device according to the second embodiment.

FIG. 6 shows a variation in the semiconductor integrated circuit device according to this embodiment. In FIG. 6, the latch circuit 3 is not located between the automatically adjusting circuit 1 and the target circuit 2. The latch circuit 3 is connected to the output of the automatically adjusting circuit 1 through the route different from the route through which the automatically adjusting circuit 1 and the target circuit 2 are connected. In this case, without any influence on the automatically adjusting circuit 1 and the target circuit 2, the latch circuit 3 can be used to obtain the adjustment code AC (adjustment result) at any time. The register circuit 5 can store the plurality of adjustment codes AC at the different timings in the time sequential manner.

Similarly to the case shown in FIG. 5, the user can properly use the adjustment code AC stored in the register circuit 5. For example, the selecting circuit 6 selects one of the plurality of adjustment codes AC stored in the register circuit 5 and can output the selected adjustment code AC' to the target circuit 2. Also, the external output circuit 7 can output the adjustment code AC stored in the register circuit 5 to the measuring unit connected externally. In accordance with the output adjustment code AC, it is possible to test the performance and property of the automatically adjusting circuit 1 at any time. In particular, when the plurality of adjustment codes AC arranged in the time sequence are outputted to the external, the test precision of the automatically adjusting circuit 1 is improved.

It should be noted that the control signal CS that activates the latch circuit 3 may be generated through a combination of external signals (a command and an address). Also, the control signal CS may be stored in advance in a predetermined register.

What is claimed is:

1. A semiconductor integrated circuit device comprising:
   a control circuit configured to generate a control code to control a parameter of a predetermined circuit and outputs said control code to the predetermined circuit; and
   a latch circuit connected with an output of said control circuit to latch said control code in response to a control signal.

2. The semiconductor integrated circuit device according to claim 1, further comprising:
   an external output circuit connected with said latch circuit to output said control code latched by said latch circuit to an external unit.

3. The semiconductor integrated circuit device according to claim 1, further comprising:
   a register circuit connected with said latch circuit, comprising at least one register and configured to store said control code.

4. The semiconductor integrated circuit device according to claim 1, wherein said latch circuit is provided between said control circuit and said predetermined circuit to latch said control code or transfer said control code to said predetermined circuit, in response to said control signal.

5. The semiconductor integrated circuit device according to claim 1, wherein said latch circuit is connected with said control circuit through a path different from a path through which said control circuit is connected with said predetermined circuit.

6. The semiconductor integrated circuit device according to claim 5, further comprising:
   an external output circuit connected with said latch circuit to output said control code latched by said latch circuit to an external unit.

7. The semiconductor integrated circuit device according to claim 5, further comprising:
   a register circuit connected with said latch circuit, comprising at least one register and configured to store said control code.

8. The semiconductor integrated circuit device according to claim 7, further comprising:
   an external output circuit connected with said register circuit to output said control code to an external unit.

9. The semiconductor integrated circuit device according to claim 7, wherein said register circuit comprises a plurality of registers configured to store a plurality of said control codes in time series.

10. The semiconductor integrated circuit device according to claim 9 further comprising:
    a selecting circuit configured to select one of said plurality of control codes and to output said selected control code to said predetermined circuit.

11. The semiconductor integrated circuit device according to claim 10, further comprising:
    an external output circuit connected with said register circuit to output said control code to an external unit.

12. The semiconductor integrated circuit device according to claim 1, wherein said control circuit is an impedance control circuit configured to control an impedance of said predetermined circuit.

13. The semiconductor integrated circuit device according to claim 12, wherein said predetermined circuit and said control circuit are provided in a DRAM.

14. A method of testing a semiconductor integrated circuit device which comprises a control circuit configured to a parameter of a predetermined circuit and a latch circuit, comprising:
    (A) generating a control code to control the parameter of said predetermined circuit by said control circuit and outputting said control code to said predetermined circuit;
    (B) latching said control code by said latch circuit in response to a control signal; and
    (C) testing performance of said control circuit based on said control code.

15. A semiconductor integrated circuit device comprising:
    a control circuit configured to receive a comparison result of a first signal and a second signal and generate a control code in response to the comparison result, the control code being supplied to a predetermined circuit to control a parameter of the predetermined circuit; and
    a latch circuit connected with an output of said control circuit to latch said control code in response to a control signal.

16. The semiconductor integrated circuit device according to claim 15, further comprising a comparison circuit that compares the first signal with the second signal to generate the comparison result and outputs the comparison result to the control circuit.

17. The semiconductor integrated circuit device according to claim 15, wherein the first signal changes in response to the control code and the second signal is constant.

18. The semiconductor integrated circuit device according to claim 15, further comprising:
    a replica circuit that has the same characteristics as the predetermined circuit, the replica circuit outputting the first signal in response to the control code; and
    a generator that generates the second signal that has a constant potential.

* * * * *